(12) United States Patent
Chiang et al.

(10) Patent No.: US 6,416,822 B1
(45) Date of Patent: Jul. 9, 2002

(54) CONTINUOUS METHOD FOR DEPOSITING A FILM BY MODULATED ION-INDUCED ATOMIC LAYER DEPOSITION (MII-ALD)

(75) Inventors: Tony P. Chiang, Santa Clara; Karl F. Leeser, Sunnyvale, both of CA (US)

(73) Assignee: Angstrom Systems, Inc., Santa Clara, CA (US)

( * ) Notice: Subject to any disclaimer, the term of this patent is extended or adjusted under 35 U.S.C. 154(b) by 0 days.

(21) Appl. No.: 09/812,486

(22) Filed: Mar. 19, 2001

Related U.S. Application Data

(60) Provisional application No. 60/251,795, filed on Dec. 6, 2000, and provisional application No. 60/254,280, filed on Dec. 6, 2000.

(51) Int. Cl.[7] .................................................. B05D 3/00
(52) U.S. Cl. .................. 427/561; 427/252; 427/255.29; 427/314; 427/573; 427/576; 427/582
(58) Field of Search ................................ 427/561, 573, 427/576, 582, 252, 255.29, 314

(56) References Cited

U.S. PATENT DOCUMENTS

| | | |
|---|---|---|
| 4,401,054 A | 8/1983 | Matsuo et al. |
| 4,534,842 A | 8/1985 | Arnal et al. |
| 4,563,367 A | 1/1986 | Sherman |
| 4,745,337 A | 5/1988 | Pichot et al. |
| 5,061,838 A | 10/1991 | Lane et al. |

(List continued on next page.)

OTHER PUBLICATIONS

T.P. Chiang, et al., "Ion–induced chemcial vapor deposition of high purity Cu films at room temperature using a microwave discharge H atom beam source," Journal Vacuum Science Technology, Sep./Oct. 1997, p. 2677–2686, vol. A 15(5), American Vacuum Society.

T.P. Chiang, et al., "Surface kinetic study of ion–induced chemical vapor deposition of copper for focused ion beam applications," Journal Vacuum Science Technology, Nov./Dec. 1997, p. 3104–3114, vol. A 15(6), American Vacuum Society.

K.A. Ashtiani, et al., A New Hollow–Cathode Magnetron Source for 0.10um Copper Applications, Novellus Systems, Inc., San Jose, CA.

Xiaomeng Chen, et al., "Low temperature plasma–promoted chemical vapor deposition of tantalum from pentabromide for copper metallization," Journal Vacuum Science Technology, Sep./Oct. 1998, p. 2887–2890, vol. B 16(5), American Vacuum Society.

Xiaomeng Chen, et al., "Low temperature plasma–assisted chemical vapor deposition of tantalum nitride from tantalum pentabromide for copper metallization," Journal of Vacuum Science Technology, Jan./Feb. 1999, p. 182–185, vol. B 17(1), American Vacuum Society.

Per Martensson, "Atomic Layer Epitaxy of Copper," Comprehensive Summaries of Uppsala Dissertations from the Faculty of Science and Technology, 1999, p. 1–45, Acta Universitis Upsaliensis, Uppsala, Sweden.

(List continued on next page.)

Primary Examiner—Bernard Pianalto
(74) Attorney, Agent, or Firm—Carr & Ferrell LLP; Bradley W. Scheer; V. Randall Gard

(57) ABSTRACT

The present invention relates to an enhanced non-sequential atomic layer deposition (ALD) technique suitable for deposition of barrier layers, adhesion layers, seed layers, low dielectric constant (low-k) films, high dielectric constant (high-k) films, and other conductive, semi-conductive, and non-conductive films. This is accomplished by 1) providing a non-thermal or non-pyrolytic means of triggering the deposition reaction; 2) providing a means of depositing a purer film of higher density at lower temperatures; and, 3) providing a faster and more efficient means of modulating the deposition sequence and hence the overall process rate resulting in an improved deposition method.

64 Claims, 11 Drawing Sheets

U.S. PATENT DOCUMENTS

| | | |
|---|---|---|
| 5,102,687 A | 4/1992 | Pelletier et al. |
| 5,223,457 A | 6/1993 | Mintz et al. |
| 5,227,695 A | 7/1993 | Pelletier et al. |
| 5,478,403 A | 12/1995 | Shinagawa et al. |
| 5,483,919 A | 1/1996 | Yokoyama et al. |
| 5,536,914 A | 7/1996 | Pelletier et al. |
| 5,605,637 A | 2/1997 | Shan et al. |
| 5,653,811 A | 8/1997 | Chan |
| 5,666,023 A | 9/1997 | Pelletier |
| 5,702,530 A | 12/1997 | Shan et al. |
| 5,762,714 A | 6/1998 | Mohn et al. |
| 5,916,365 A | 6/1999 | Sherman |
| 6,054,016 A | 4/2000 | Tuda et al. |
| 6,080,446 A | 6/2000 | Tobe et al. |
| 6,103,304 A | 8/2000 | Mizuno |
| 6,200,893 B1 | 3/2001 | Sneh |

OTHER PUBLICATIONS

Per Martensson, et al., "Atomic Layer Epitaxy of Copper on Tantalum," Chemical Vapor Deposition, 1997, p. 45–50, vol. 3 No. 1, Weinheim.

Mikko Ritala, et al., "Controlled Growth of TaN, Ta3N5, and TaOxNy Thin Films by Atomic Layer Deposition," Chemical Materials, 1999, p. 1712–1718, vol. 11 No. 7, American Chemical Society.

CONTINUOUS METHOD FOR DEPOSITING A FILM BY MODULATED ION-INDUCED ATOMIC LAYER DEPOSITION (MII-ALD)

CROSS-REFERENCE TO RELATED APPLICATIONS

This application claims the benefit of U.S. Provisional Application No. 60/251,795, filed Dec. 6, 2000, and U.S. Provisional Application No. 60/254,280, filed Dec. 6, 2000.

BACKGROUND OF THE INVENTION

The present invention relates generally to the field of advanced thin film deposition methods commonly used in the semiconductor, data storage, flat panel display, as well as allied or other industries. More particularly, the present invention relates to an enhanced sequential or non-sequential atomic layer deposition (ALD) apparatus and technique suitable for deposition of barrier layers, adhesion layers, seed layers, low dielectric constant (low-k) films, high dielectric constant (high-k) films, and other conductive, semi-conductive, and non-conductive thin films.

The disadvantages of conventional ALD are additionally discussed in a copending application with the same assignee entitled "Method and Apparatus for Improved Temperature Control in Atomic Layer Deposition", which is hereby incorporated by reference in its entirety and may be found as copending provisional, Application No. 60/251,795.

BRIEF DESCRIPTION OF THE PRIOR ART

As integrated circuit (IC) dimensions shrink and the aspect ratios of the resulting features increase, the ability to deposit conformal, ultra-thin films on the sides and bottoms of high aspect ratio trenches and vias becomes increasingly important. These conformal, ultra-thin films are typically used as "liner" material to enhance adhesion, prevent inter-diffusion and/or chemical reaction between the underlying dielectric and the overlying metal, and promote the deposition of a subsequent film.

In addition, decreasing device dimensions and increasing device densities has necessitated the transition from traditional CVD tungsten plug and aluminum interconnect technology to copper interconnect technology. This transition is driven by both the increasing impact of the RC interconnect delay on device speed and by the electromigration (i.e., the mass transport of metal due to momentum transfer between conducting electrons and diffusing metal atoms, thereby affecting reliability) limitations of aluminum based conductors for sub 0.25 $\mu$m device generations. Copper is preferred due to its lower resistivity and higher (greater than 10 times) electromigration resistance as compared to aluminum. A single or dual damascene copper metallization scheme is used since it eliminates the need for copper etching and reduces the number of integration steps required. However, the burden now shifts to the metal deposition step(s) as the copper must fill predefined high aspect ratio trenches and/or vias in the dielectric. Electroplating has emerged as the copper fill technique of choice due to its low deposition temperature, high deposition rate, and potential low manufacturing cost.

Two major challenges exist for copper wiring technology: the barrier and seed layers. Copper can diffuse readily into silicon and most dielectrics. This diffusion may lead to electrical leakage between metal wires and poor device performance. An encapsulating barrier layer is needed to isolate the copper from the surrounding material (e.g., dielectric or Si), thus preventing copper diffusion into and/or reaction with the underlying material (e.g. dielectric or Si). In addition, the barrier layer also serves as the adhesion or glue layer between the patterned dielectric trench or via and the copper used to fill it. The dielectric material can be a low dielectric constant, i.e. low-k material (used to reduce inter- and intra-line capacitance and cross-talk) which typically suffers from poorer adhesion characteristics and lower thermal stability than traditional oxide insulators. Consequently, this places more stringent requirements on the barrier material and deposition method. An inferior adhesion layer will, for example, lead to delamination at either the barrier-to-dielectric or barrier-to-copper interfaces during any subsequent anneal and/or chemical mechanical planarization (CMP) processing steps leading to degradation in device performance and reliability. Ideally, the barrier layer should be thin, conformal, defect free, and of low resistivity so as to not compromise the conductance of the copper metal interconnect structure.

In addition, electroplating fill requires a copper seed layer, which serves to both carry the plating current and act as the nucleation layer. The preferred seed layer should be smooth, continuous, of high purity, and have good step coverage with low overhang. A discontinuity in the seed layer will lead to sidewall voiding, while gross overhang will lead to pinch-off and the formation of top voids.

Both the barrier and seed layers which are critical to successful implementation of copper interconnects require a means of depositing high purity, conformal, ultra-thin films at low substrate temperatures.

Physical vapor deposition (PVD) or sputtering has been adopted as the preferred method of choice for depositing conductor films used in IC manufacturing. This choice has been primarily driven by the low cost, simple sputtering approach whereby relatively pure elemental or compound materials can be deposited at relatively low substrate temperatures. For example, refractory based metals and metal compounds such as tantalum (Ta), tantalum nitride (TaN$_x$), other tantalum containing compounds, tungsten (W), tungsten nitride (WN$_x$), and other tungsten containing compounds which are used as barrier/adhesion layers can be sputter deposited with the substrate at or near room temperature. However, as device geometries have decreased, the step coverage limitations of PVD have increasingly become an issue since it is inherently a line-of-sight process. This limits the total number of atoms or molecules which can be delivered into the patterned trench or via. As a result, PVD is unable to deposit thin continuous films of adequate thickness to coat the sides and bottoms of high aspect ratio trenches and vias. Moreover, medium/high-density plasma and ionized PVD sources developed to address the more aggressive device structures are still not adequate and are now of such complexity that cost and reliability have become serious concerns.

Chemical vapor deposition (CVD) processes offer improved step coverage since CVD processes can be tailored to provide conformal films. Conformality ensures the deposited films match the shape of the underlying substrate, and the film thickness inside the feature is uniform and equivalent to the thickness outside the feature. Unfortunately, CVD requires comparatively high deposition temperatures, suffers from high impurity concentrations, which impact film integrity, and have higher cost-of-ownership due to long nucleation times and poor precursor gas utilization efficiency. Following the tantalum containing barrier example, CVD Ta and TaN films require substrate temperatures ranging from 500° C. to over 800° C. and suffer from impurity concentrations (typically of carbon and oxygen) ranging from several to tens of atomic % concentration. This generally leads to high film resistivities (up to several orders of magnitude higher than PVD), and other degradation in film performance. These deposition temperatures and impurity concentrations make CVD Ta and TaN unusable for IC manufacturing, in particular for copper metallization and low-k integration.

Chen et al. ("Low temperature plasma-assisted chemical vapor deposition of tantalum nitride from tantalum pentabromide for copper metallization", J. Vac. Sci. Technol. B 17(1), pp. 182–185 (1999); and "Low temperature plasma-promoted chemical vapor deposition of tantalum from tantalum pentabromide for copper metallization", J. Vac. Sci. Technol. B 16(5), pp. 2887–2890 (1998)) have demonstrated a plasma-assisted (PACVD) or plasma-enhanced (PECVD) CVD approach using tantalum pentabromide ($TaBr_5$) as the precursor gas to reduce the deposition temperature. Ta and $TaN_x$ films were deposited from 350° C. to 450° C. and contained 2.5 to 3 atomic % concentration of bromine. Although the deposition temperature has been reduced by increased fragmentation (and hence increased reactivity) of the precursor gases in the gas-phase via a plasma, the same fragmentation leads to the deposition of unwanted impurities. Gas-phase fragmentation of the precursor into both desired and undesired species inherently limits the efficacy of this approach.

Recently, atomic layer chemical vapor deposition (AL-CVD) or atomic layer deposition (ALD) has been proposed as an alternative method to CVD for depositing conformal, ultra-thin films at comparatively lower temperatures. ALD is similar to CVD except that the substrate is sequentially exposed to one reactant at a time. Conceptually, it is a simple process: a first reactant is introduced onto a heated substrate whereby it forms a monolayer on the surface of the substrate. Excess reactant is pumped out. Next a second reactant is introduced and reacts with the first reactant to form a monolayer of the desired film via a self-limiting surface reaction. The process is self-limiting since the deposition reaction halts once the initially adsorbed (physi- or chemi-sorbed) monolayer of the first reactant has fully reacted with the second reactant. Finally, the excess second reactant is evacuated. The above sequence of events comprises one deposition cycle. The desired film thickness is obtained by repeating the deposition cycle the required number of times.

In practice, ALD is complicated by the painstaking selection of a process temperature setpoint wherein both: 1) at least one of the reactants sufficiently adsorbs to a monolayer and 2) the surface deposition reaction can occur with adequate growth rate and film purity. If the substrate temperature needed for the deposition reaction is too high, desorption or decomposition of the first adsorbed reactant occurs, thereby eliminating the layer-by-layer process. If the temperature is too low, the deposition reaction may be incomplete (i.e., very slow), not occur at all, or lead to poor film quality (e.g., high resistivity and/or high impurity content). Since the ALD process is entirely thermal, selection of available precursors (i.e., reactants) that fit the temperature window becomes difficult and sometimes unattainable. Due to the above-mentioned temperature related problems, ALD has been typically limited to the deposition of semiconductors and insulators as opposed to metals. ALD of metals has been confined to the use of metal halide precursors. However, halides (e.g., Cl, F, Br) are corrosive and can create reliability issues in metal interconnects.

Continuing with the TaN example, ALD of TaN films is confined to a narrow temperature window of 400° C. to 500° C., generally occurs with a maximum deposition rate of 0.2 Å/cycle, and can contain up to several atomic percent of impurities including chlorine and oxygen. Chlorine is a corrosive, can attack copper, and lead to reliability concerns. The above process is unsuitable for copper metallization and low-k integration due to the high deposition temperature, slow deposition rate, and chlorine impurity incorporation.

In conventional ALD of metal films, gaseous hydrogen ($H_2$) or elemental zinc (Zn) is often cited as the second reactant. These reactants are chosen since they act as a reducing agent to bring the metal atom contained in the first reactant to the desired oxidation state in order to deposit the end film. Gaseous, diatomic hydrogen ($H_2$) is an inefficient reducing agent due to its chemical stability, and elemental zinc has low volatility (e.g., it is very difficult to deliver sufficient amounts of Zn vapor to the substrate) and is generally incompatible with IC manufacturing. Unfortunately, due to the temperature conflicts that plague the ALD method and lack of kinetically favorable second reactant, serious compromises in process performance result.

In order to address the limitations of traditional thermal or pyrolytic ALD, radical enhanced atomic layer deposition (REALD, U.S. Pat. No. 5,916,365) or plasma-enhanced atomic layer deposition has been proposed whereby a downstream radio-frequency (RF) glow discharge is used to dissociate the second reactant to form more reactive radical species which drives the reaction at lower substrate temperatures. Using such a technique, Ta ALD films have been deposited at 0.16 to 0.5 Å/cycle at 25° C., and up to approximately 1.67 Å/cycle at 250° C. to 450° C. Although REALD results in a lower operating substrate temperature than all the aforementioned techniques, the process still suffers from several significant drawbacks. Higher temperatures must still be used to generate appreciable deposition rates. Such temperatures are still too high for some films of significant interest in IC manufacturing such as polymer-based low-k dielectrics that are stable up to temperatures of only 200° C. or less. REALD remains a thermal or pyrolytic process similar to ALD and even CVD since the substrate temperature provides the required activation energy for the process and is therefore the primary control means for driving the deposition reaction.

In addition, Ta films deposited using REALD still contain chlorine as well as oxygen impurities, and are of low density. A low density or porous film leads to a poor barrier against copper diffusion since copper atoms and ions have more pathways to traverse the barrier material. Moreover, a porous or under-dense film has lower chemical stability and can react undesirably with overlying or underlying films, or with exposure to gases commonly used in IC manufacturing processes.

Another limitation of REALD is that the radical generation and delivery is inefficient and undesirable. RF plasma generation of radicals used as the second reactant such as atomic H is not as efficient as microwave plasma due to the enhanced efficiency of microwave energy transfer to electrons used to sustain and dissociate reactants introduced in the plasma. Furthermore, having a downstream configuration whereby the radical generating plasma is contained in a separate vessel located remotely from the main chamber where the substrate is situated and using a small aperture to introduce the radicals from the remote plasma vessel to the main chamber body significantly decreases the efficiency of transport of the second radical reactant. Both gas-phase and wall recombination will reduce the flux of desired radicals that can reach the substrate. In the case of atomic H, these recombination pathways will lead to the formation of diatomic $H_2$, a far less effective reducing agent. If the plasma used to generate the radicals was placed directly over the substrate, then the deposition of unwanted impurities and particles can occur similarly to the case of plasma-assisted CVD.

Finally, ALD (or any derivative such as REALD) is fundamentally slow since it relies on a sequential process whereby each deposition cycle is comprised of at least two separate reactant flow and evacuation steps, which can occur on the order of minutes with conventional valve and chamber technology. Significant improvements resulting in faster ALD are needed to make it more suitable for commercial IC manufacturing.

SUMMARY AND DETAILED DESCRIPTION OF THE INVENTION

The present invention relates to methods and apparatuses useable for the deposition of conformal solid thin films of one or more elements at low temperature. More particularly, the present invention relates to an enhanced sequential or, more preferably, non-sequential atomic layer deposition apparatus and technique suitable for deposition of barrier layers, adhesion layers, seed layers, and low dielectric constant (low-k) films, high dielectric constant (high-k) films, and other conductive, semi-conductive, and non-conductive thin films.

More specifically, the present invention resolves the previously presented problems encountered in the prior art (e.g., REALD) by 1) providing a non-thermal or non-pyrolytic means of triggering the deposition reaction; 2) providing a means of depositing a purer film of higher density at lower temperatures; 3) providing a faster and more efficient means of modulating the deposition sequence and hence the overall process rate resulting in an improved deposition method; and, 4) providing a means of improved radical generation and delivery.

Improvements to ALD processing, e.g., the REALD mentioned previously, remain "thermal" or "pyrolytic" processes since the substrate temperature provides the required activation energy and is the primary control knob for driving the deposition reaction. Alternatively, we propose a novel approach by providing the required activation energy from a "non-thermal" source. In particular, we propose driving the deposition reaction primarily via substrate exposure to impinging ions wherein the ions are used to deliver the necessary activation energy to the near surface atoms and adsorbed reactant(s) via collision cascades.

Conventional deposition processes used in the semiconductor industry (including ALD) typically deposit materials at temperatures in the range of 300–600° C. The deposition method described herein can be effected at much lower temperatures, in practice as low as 25° C. or below. Note that this process is ion-triggered (i.e., ion-induced) as opposed to ion-assisted in that deposition will not generally occur without ion bombardment since ions are used as the primary means of providing the activation energy required for deposition. A primary benefit of ion-induced processing is the deposition of higher density films of superior purity and adhesion properties. This result occurs due to ion bombardment induced densification.

Figure 1:
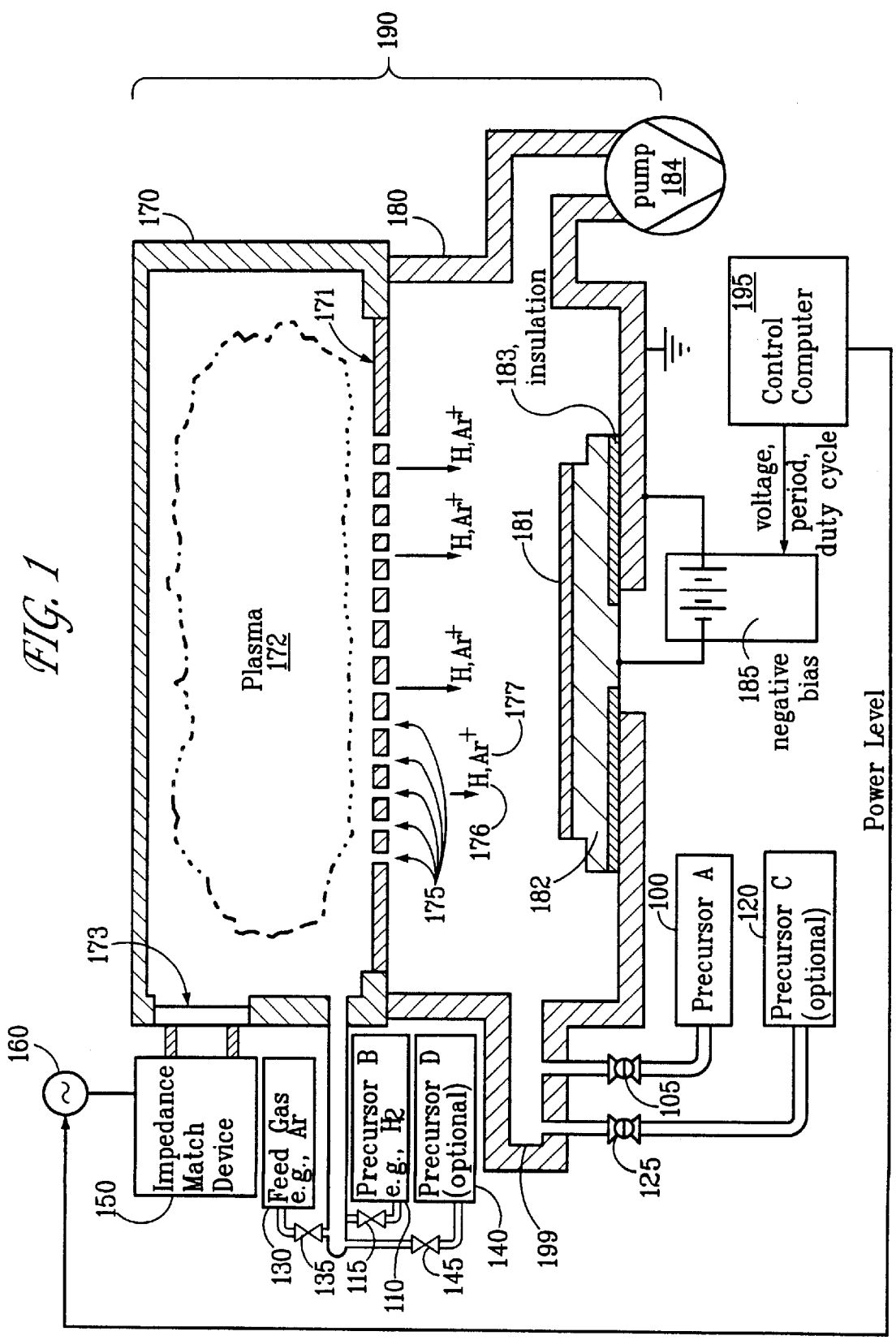
FIG. 1 is a schematic of a deposition system suitable for modulated ion-induced atomic layer deposition (MII-ALD).

FIG. 1 illustrates a deposition system suitable for: modulated ion-induced atomic layer deposition (MII-ALD). The invention described herein also incorporates a means of modulating the exposure of the substrate to ions. By modulating 1) the ion flux; 2) the energy of the ions striking the substrate; or a combination of (1) and (2), the deposition reaction can be precisely toggled "on" or "off". If the ion flux or energy is at a "low" state, then no deposition results or deposition occurs so slowly that essentially no deposition results. If the impinging ion flux or energy is at a "high" state, then deposition occurs. Since the substrate (which may be a "bare" substrate, e.g., a silicon wafer before any films have been deposited, or it may be a substrate which may already have had one or more films deposited on its surface) 181 is preferably maintained at a low substrate temperature, the first and second reactants do not thermally react with any appreciable rate or do not react at all. Instead, the deposition reaction only takes place when either the ion flux or ion energy is toggled to a suitable "high state". The desired film thickness is built up by repeating the ion pulses (either of flux or energy) the required number of cycles. Furthermore, since modulation of the ion flux or ion energy can occur on a much faster time scale (KHz range) than the conventional valve and pump technology used in ALD (up to minutes per cycle), this deposition method is more suitable for commercial IC manufacturing. This method shall be referred to herein as modulated ion-induced atomic layer deposition (MII-ALD).

In addition, the present invention also improves upon the prior art by employing a microwave generated plasma 172 substantially contained in the main chamber body 190 that is isolated via a distribution showerhead 171 comprised of a series or array of apertures 175 which resolves the issues of radical generation and delivery, while preventing gas-phase precursor cracking (i.e., fragmentation or breaking down the precursor gas into its constituent elements) and impurity and/or particle generation directly above the wafer 181. The plasma is contained within the plasma source chamber 170 itself and is not in direct communication with the substrate 181. In MII-ALD, the same plasma is used to generate both ions 177 (used to drive the surface reactions) and radicals 176 (used as the second reactant), but is isolated from the first reactant 100 which typically contains both the principal element(s) desired in the end film, but also unwanted impurity containing byproducts. Therefore, primarily only the radicals 176 and ions 177 are able to travel through the showerhead apertures 175. The plasma 172 is essentially contained within the plasma source chamber and does not intermingle with the precursor gases 100, 120.

The present invention utilizes ion imparted kinetic energy transfer rather than thermal energy (e.g., REALD, ALD, PECVD, CVD, etc.) to drive the deposition reaction. Since temperature can be used as a secondary control variable, with this enhancement films can be deposited using MII-ALD at arbitrarily low substrate temperatures (generally less than 350° C.). In particular, films can be deposited at or near room temperature (i.e., 25° C.) or below.

The system of FIG. 1 contains a substantially enclosed plasma source chamber 170 located in substantial communication with or, more preferably, substantially within a main chamber body 190. The plasma 172 is used to dissociate feed gases 130, 110 to generate both ions 177 and radicals 176. Typical feed gases 130 used for ion generation include, but are not restricted to Ar, Kr, Ne, and Xe. Typical feed gases 110 (e.g., precursor B) used for radical generation include, but are not restricted to $H_2$, $O_2$, $N_2$, $NH_3$, and $H_2O$ vapor. The ions 177 are used to deliver the energy needed to drive surface reactions between the first adsorbed reactant and the generated radicals 176. Inductively coupled RF (e.g., 400 KHz, 2 MHz, 13.56 MHz, etc.) power 160 can be used to generate the plasma via solenoidal coils located within or outside of the plasma chamber (not shown in FIG. 1). More preferably, microwave (e.g., generally 2.45 GHz or higher frequencies) power 160 is coupled to the plasma source chamber 170 via a suitable means such as a waveguide or coaxial cable. Microwave energy can be more efficiently transferred to ionizing electrons, leading to higher ionization fractions. This is of particular importance in the generation of radicals 176 (i.e., a chemical fragment of a larger molecule) such as atomic hydrogen, or any of a number of other reactive groups such as nitrogen atoms (N), oxygen atoms (O), OH molecules, or NH molecules, or a combination thereof. These radicals serve as the second reactant. Microwave or radio-frequency (RF) power 160 is coupled to the plasma 172 via a dielectric material 173, which may be a dielectric window such as quartz embedded in the chamber wall, or it may be empty space in the case of a microwave or RF antenna located within the plasma chamber.

In addition, a distribution showerhead 171, containing a series or array of apertures 175 through which ions 177 and radicals 176 are delivered to the substrate 181, isolates the main process chamber 180 from the plasma source chamber 170. A pressure drop (for example, a 5 or 10 times decrease in pressure, with the main processing chamber 180 being at the lower pressure) is thereby created between the plasma source chamber 170 and the main processing chamber 180 to project the ions 177 and radicals 176 to the substrate 181 via the distribution showerhead 171. The plasma source chamber 170 is generally of comparable diameter to the main chamber body 190 to enable large area exposure of the sample. The size, aspect ratio, and distribution of the showerhead apertures 175 can be optimized to provide uniform exposure of the substrate 181 and the desired ion 177 to radical 176 ratio. The distance between this showerhead 171 and the substrate 181 may vary depending on the application. For the processing of wafers in the IC industry, this distance is preferably at most two wafer diameters and more preferably less than or equal to one half a wafer diameter.

Having a substantially enclosed plasma generation chamber 170 situated within the main chamber 190 allows efficient and uniform delivery of ions 177 and radicals 176 to the substrate 181. In addition, by isolating the plasma 172 from the main chamber 180 prevents gas-phase cracking of the first reactant 100 (e.g., precursor A), which is introduced directly to the main processing chamber 180 via a gas distribution manifold 199. Precursor A 100 may be any one or more of a series of gaseous compounds used for depositing semiconductors, insulators, metals or the like that are well-known in the art (e.g, PDEAT (pentakis(diethylamido) tantalum), PEMAT (pentakis(ethylmethylamido)tantalum), $TaBr_5$, $TaCl_5$, TBTDET (t-butylimino tris(diethylamino) tantalum), $TiCl_4$, TDMAT (tetrakis(dimethylamido) titanium), TDEAT (tetrakis(diethylamino)titanium), CuCl, Cupraselect® ((Trimethylvinylsilyl) hexafluoroacetonato Copper I), $W(CO)_6$, $WF_6$, etc.) and examples will be further discussed herein. Finally, the ion/radical distribution showerhead 171 shields the dielectric wall 173 adjacent to the supplied RF or microwave power 160 against being coated by precursor A 100 during processing which can degrade power transfer to the plasma 172 in processing systems found in the prior art. This is of particular importance in the case of deposition of conductors whereby if the dielectric 173 is fully exposed to the metal containing first reactant 100 (e.g., precursor A) and if the plasma 172 was directly generated within the main chamber 190 without the use of an isolating distribution showerhead 171, then metal deposition onto the dielectric 173 will eventually shield out RF or microwave power 160 from the plasma 172 such that the plasma 172 will extinguish.

Figure 2A:
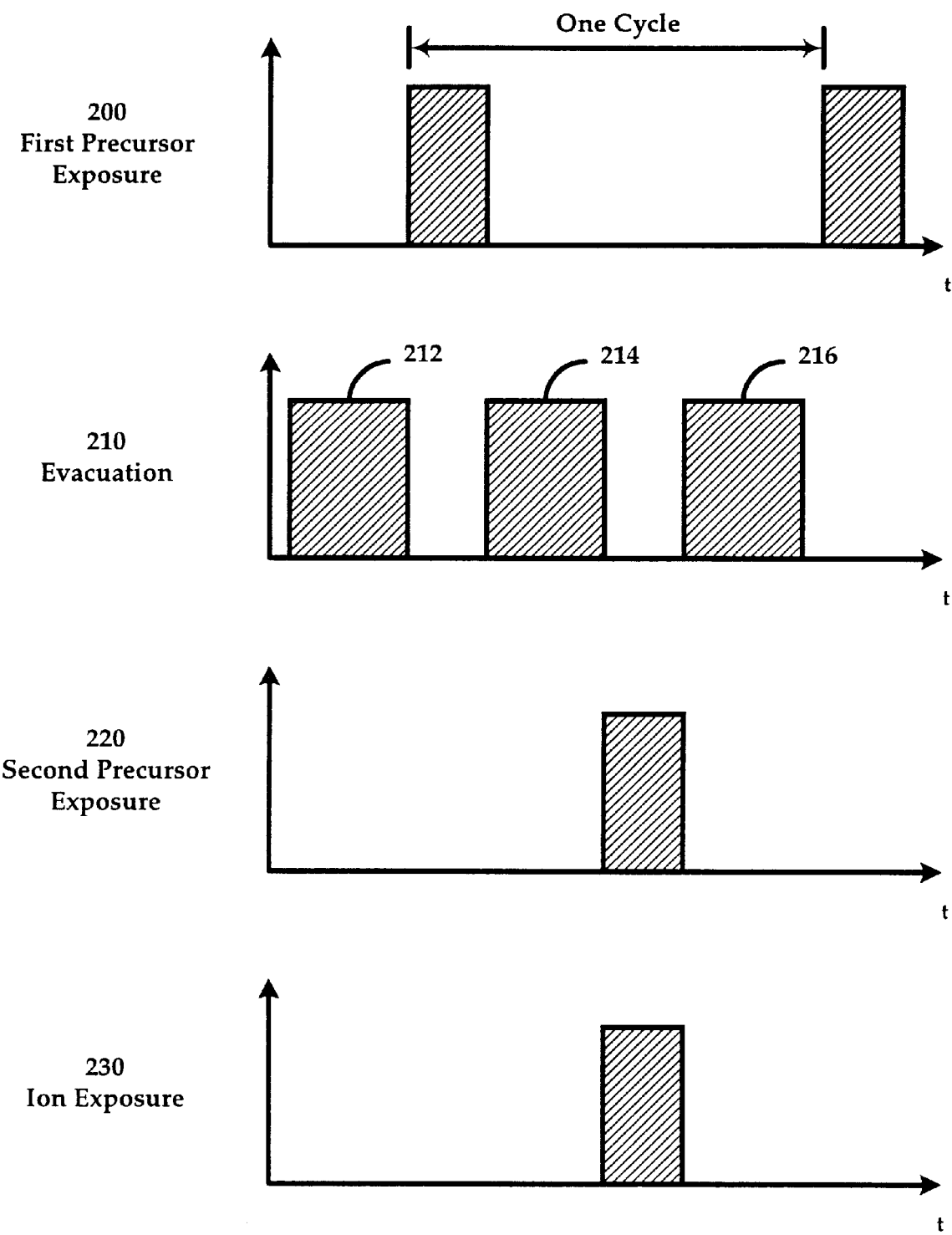
FIG. 2A depicts a timing sequence for an improved ALD method incorporating periodic exposure of the substrate to ions.

FIG. 2A depicts a sequence for an improved ALD method incorporating periodic exposure of the substrate to ions. In this variant of the method, ion exposure 230 begins with the introduction of the second precursor 220 (especially when plasma generated radicals 176 are used as the second precursor or reactant). This figure illustrates one embodiment of MII-ALD utilizing the apparatus described in FIG. 1. This results in an enhanced sequential ALD process as follows:

1) First exposure 200: The substrate 181 is exposed to a first gaseous reactant 100 (e.g., precursor A), allowing a monolayer of the reactant to form on the surface. The substrate 181 may be at any temperature below the decomposition temperature of the first gaseous reactant although it is preferable for the temperature to generally be less than approximately 350° C.

2) First evacuation 210: The excess reactant 100 is removed by evacuating 214 the chamber 180 with a vacuum pump 184.

3) Second exposure 220: Unlike conventional ALD, the substrate 181 is simultaneously exposed to ions 177 and a second gaseous reactant (e.g., microwave or RF plasma generated radicals 176) during this step with the substrate 181 (e.g., wafer) biased to a negative potential $V_{bias}$ 185. Microwave or RF power 160 is supplied into the plasma chamber 170 to generate both the ions 177 (e.g., argon-ion ($Ar^+$)) and radicals 176 (e.g., H atoms). The ions will strike the wafer 181 with an energy approximately equal to $(e|V_{bias}|+e|V_p|)$ where $V_p$ is the plasma 172 potential (typically 10V to 20V). $V_{bias}$ (−20V to −500V) is typically chosen to be greater than $V_p$ in magnitude, and is used to control the ion 177 energy. With the activation energy now primarily supplied by ions 177 instead of thermal energy, the first and second (chemi- or physi-sorbed) reactants react via an ion-induced surface reaction to produce a solid thin monolayer of the desired film at a reduced substrate temperature below conventional ALD. The deposition reaction between the first and second reactants is self-limiting in that the reaction between them terminates after the initial monolayer of the first reactant 100 is consumed.

4) Second evacuation 210: The excess second reactant is removed by again evacuating 216 the chamber 180 with the vacuum pump 184.

5) Repeat: The desired film thickness is built up by repeating the entire process cycle (steps 1–4) many times.

Additional precursor gases (e.g., 120, 140) may be introduced and evacuated as required for a given process to create tailored films of varying compositions or materials. As an example, an optional exposure may occur in the case of a compound barrier of varying composition. For example, a $TaN_x/Ta$ film stack is of interest in copper technology since $TaN_x$ prevents fluorine attack from the underlying fluorinated low-k dielectrics, whereas the Ta promotes better adhesion and crystallographic orientation for the overlying copper seed layer. The $TaN_x$ film may be deposited using a tantalum containing precursor (e.g., $TaCl_5$, PEMAT, PDEAT, TBTDET) as the first reactant 100 (precursor A) and a mixture of atomic hydrogen and atomic nitrogen (i.e. flowing a mixture of $H_2$ and $N_2$ into the plasma source 172) as the second reactant to produce a $TaN_x$ film. Simultaneous ion exposure is used to drive the deposition reaction. Next a Ta film may be deposited in a similar fashion by using atomic hydrogen (as opposed to a mixture of atomic hydrogen and nitrogen) as the second reactant. An example of a tailored film stack of differing materials can be the subsequent deposition of a copper layer over the $TaN_x/Ta$ bi-layer via the use of a copper containing organometallic (e.g., Cu(TMVS)(hfac) or (Trimethylvinylsilyl) hexafluoroacetylacetonato Copper I, also known by the trade name CupraSelect®, available from Schumacher, a unit of Air Products and Chemicals, Inc., 1969 Palomar Oaks Way, Carlsbad, Calif. 92009) or inorganic precursor (e.g. CuCl) shown as precursor C 120 in FIG. 1. The copper layer can serve as the seed layer for subsequent electroless or electroplating deposition.

Figure 2B:
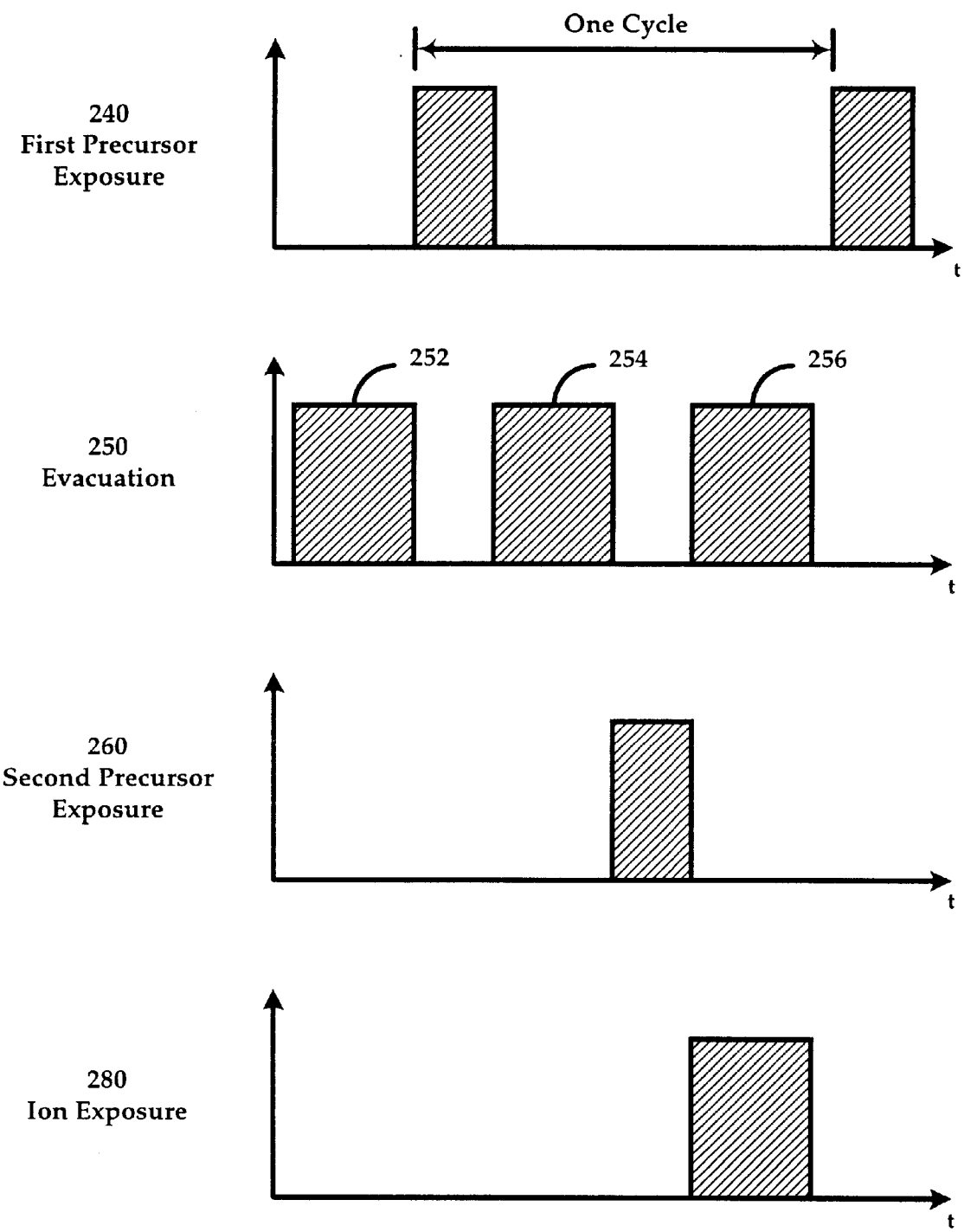
FIG. 2B is another timing sequence for an improved ALD method incorporating periodic exposure of the substrate to ions.

A variant of the method shown in FIG. 2A is illustrated in FIG. 2B where ion exposure is initiated after the second reactant exposure. FIG. 2B depicts a sequence for an improved ALD method incorporating periodic exposure of the substrate 181 to ions 177. In this variant of the method, ion exposure 280 begins with the evacuation 250 of the second precursor 256 (especially when the second precursor or reactant is not subjected to a plasma). Typically, this is the case where the second precursor or reactant is not a plasma-generated radical.

In the previous embodiments of MII-ALD, although the deposition temperature can be lowered significantly, the first and second reactants are still sequentially introduced into the main process chamber 180, and hence will still be a slow process. It is of particular interest to eliminate or replace the time-consuming flow-evacuation-flow-evacuation sequential nature of the process.

In the preferred embodiment of the MII-ALD process, a substrate 181 heated (e.g., to a low temperature of less than or equal to 350° C.) or unheated is simultaneously exposed to a first reactant and a second reactant, and subjected to modulated ion 177 exposure. By modulating 1) the ion flux (i.e. the number of ions hitting the substrate per unit area per unit time); 2) the energy of the ions striking the substrate; or a combination of (1) and (2), the deposition reaction can be precisely toggled "on" or "off". Since the substrate 181 is preferably maintained at a low substrate temperature, the first and second reactants do not thermally react with any appreciable rate or do not react at all when the ion flux or energy is toggled to a "low" state. Instead, the deposition reaction only takes place when either the ion flux or ion energy is toggled to a suitable "high state". Ion flux or energy modulation can vary generally from 0.1 Hz to 20 MHz, preferably from 0.01 KHz to 10 KHz. During deposition, the main process chamber 180 pressure can be maintained in the range of generally $10^2$ to $10^{-7}$ torr, more preferably from $10^1$ to $10^{-4}$ torr, depending on the chemistry involved. The desired film thickness is attained via exposure of the substrate to the suitable number of modulated ion flux or energy pulse cycles. This MII-ALD scheme results in a "continuous" deposition process that is significantly faster than conventional sequential ALD since the two, slow evacuation steps (up to minutes) are eliminated and replaced by the faster (KHz range or above) ion modulation steps. The modulation can be either of the ion flux via the plasma power or of the ion energy via an applied periodic wafer bias.

Figure 3A:
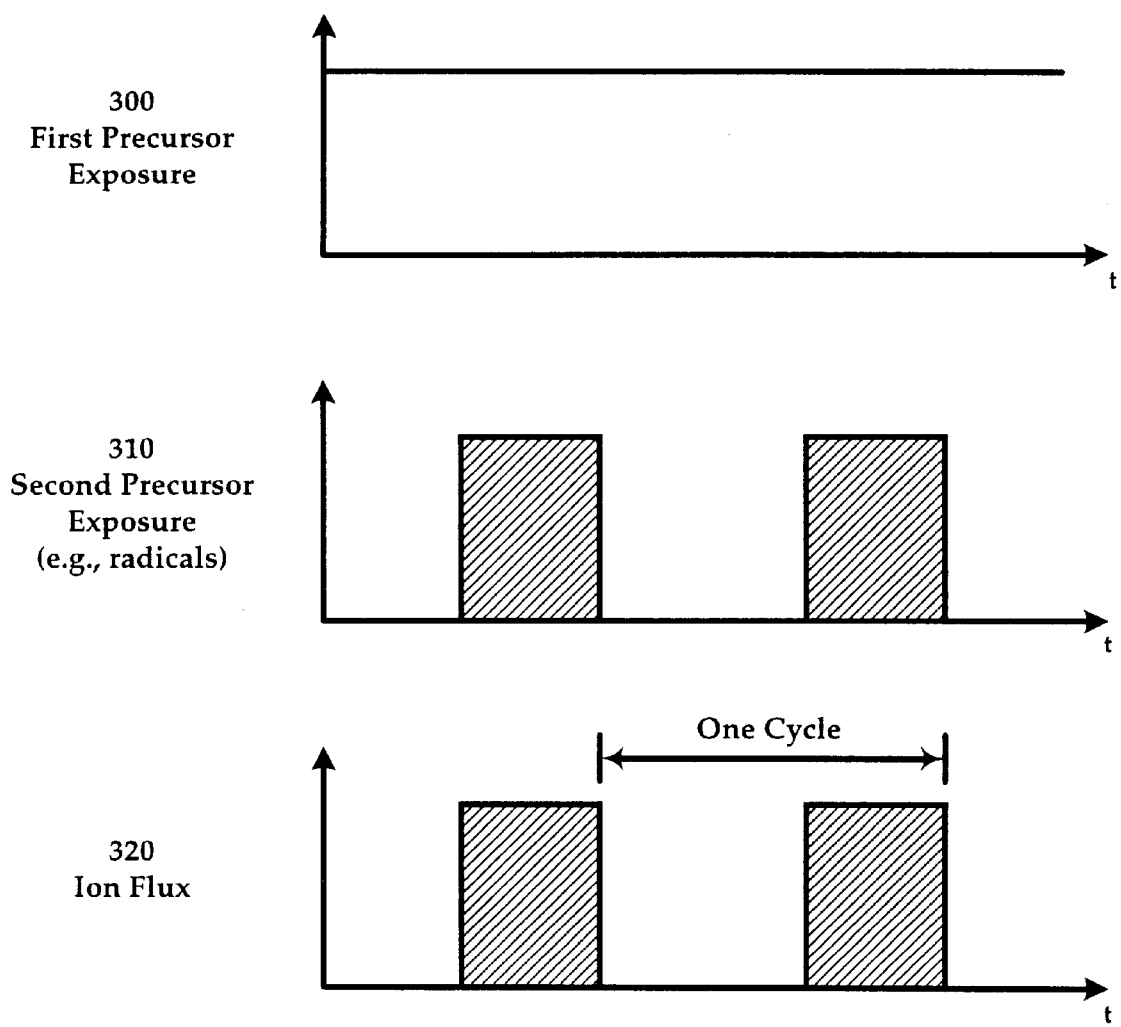
FIG. 3A shows the MII-ALD method utilizing ion flux modulation to vary the substrate exposure to ions.
Figure 4A:
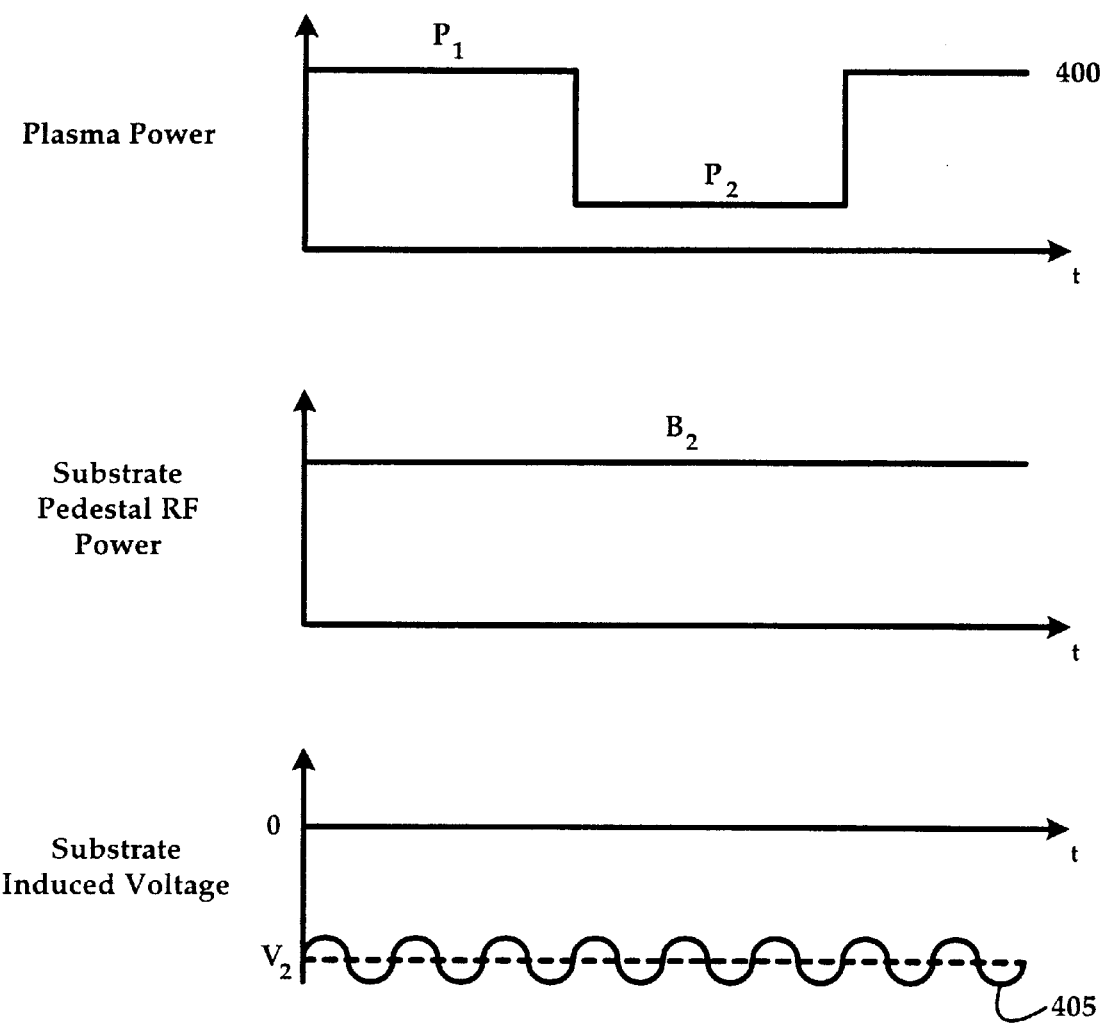
FIGS. 4A, 4B, 4C, 4D and F show methods of modulating the MII-ALD process.
Figure 4B:
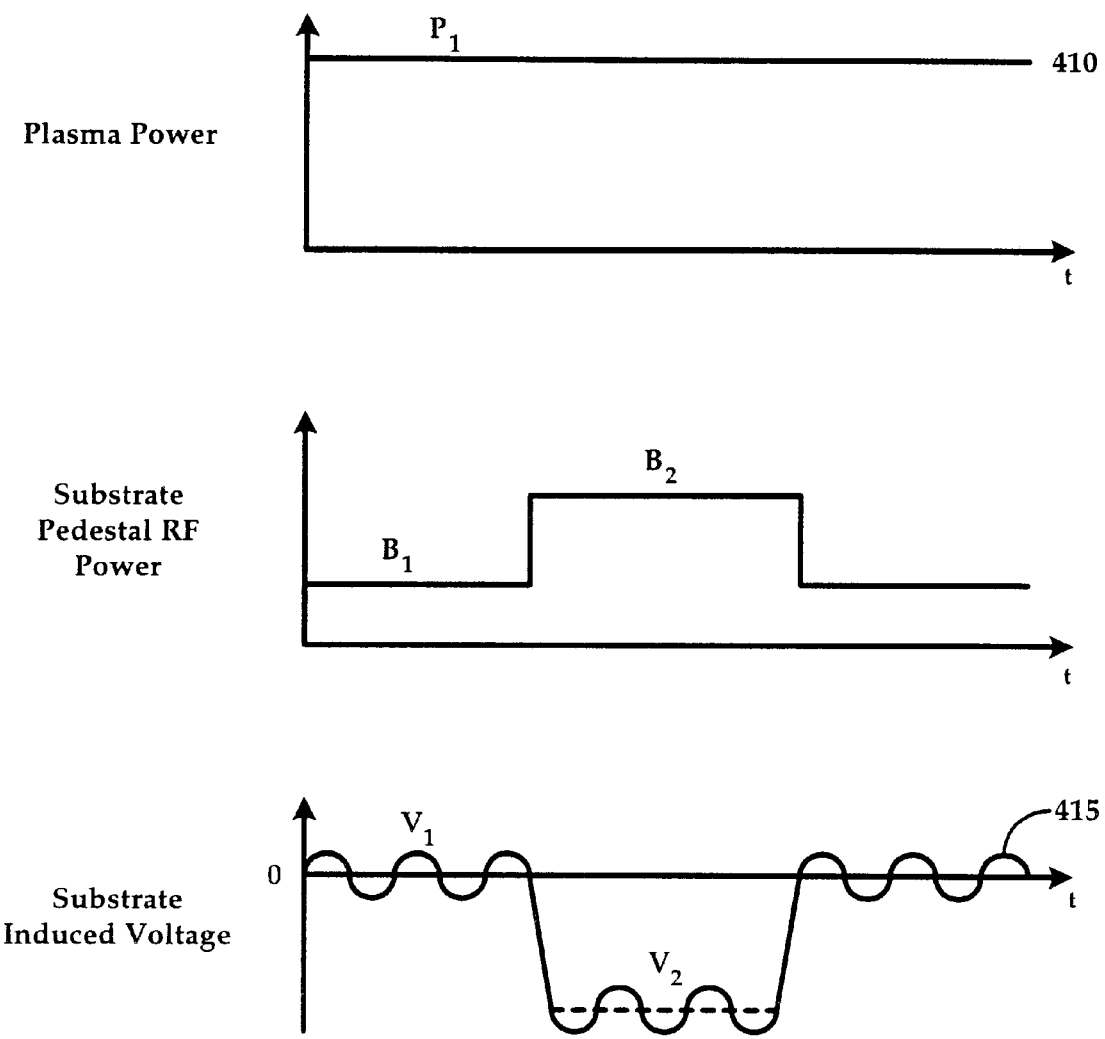
Figure 4C:
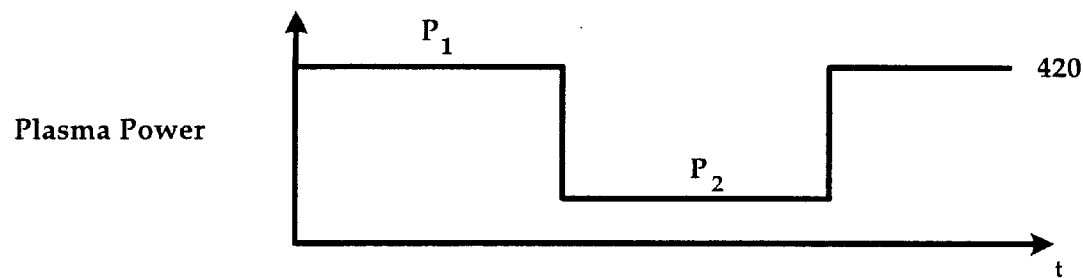
Figure 4C:

The MII-ALD method utilizing ion flux modulation to control the deposition cycle is illustrated conceptually in FIG. 3A, with the flux modulation scheme described more explicitly in FIGS. 4A and 4C. FIG. 3A depicts the MII-ALD method utilizing ion flux modulation 320 to vary the substrate 181 exposure to ions 177. Note that the second reactant 310, e.g., radicals, is synchronized with the ion flux via 320 plasma power modulation, causing a periodic exposure of the substrate to ions and radicals. Varying the power 160 delivered to the plasma 172 can vary the ion flux from little or none to maximum ion production. Plasma power modulation can take the form of variations in frequency (periodicity), magnitude, and duty-cycle. Increasing plasma power 160 leads to increasing plasma 172, and hence, increased ion 177 density. Since the deposition process is ion-induced, having little or no ion bombardment will essentially stop the deposition process, whereas increased ion bombardment will cause deposition to occur. A constant wafer bias 185 (DC in FIG. 4C or RF in FIG. 4A) is applied to define the ion energy of the modulated ion flux in this embodiment and is chosen to be sufficiently high so that ion-induced surface reactions can occur. Note that in this embodiment since the plasma (either RF or preferably microwave) power 160 is used to generate both ions 177 and radicals 176, the second reactant (e.g., radicals) flux 310 is synchronized with the ion flux 320 pulses. The radical feed gas 110 ($H_2$ for example) flow, however, does not change. Instead, the radical flux 310 (e.g., fraction of $H_2$ which is converted to atomic H) is modulated.

Figure 3B:
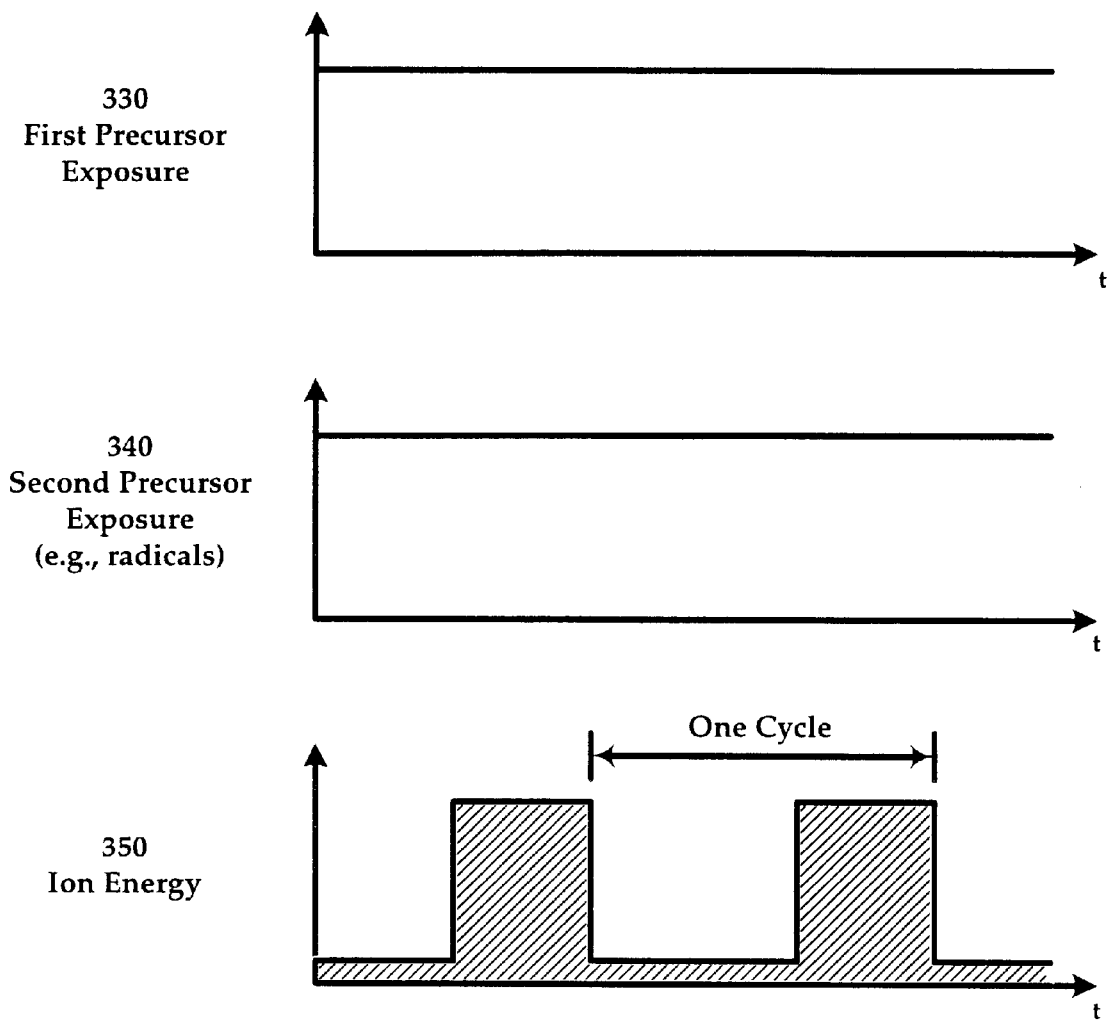
FIG. 3B shows the timing of the MII-ALD method utilizing ion energy modulation to vary the substrate exposure to ions by varying the substrate bias.
Figure 4D:
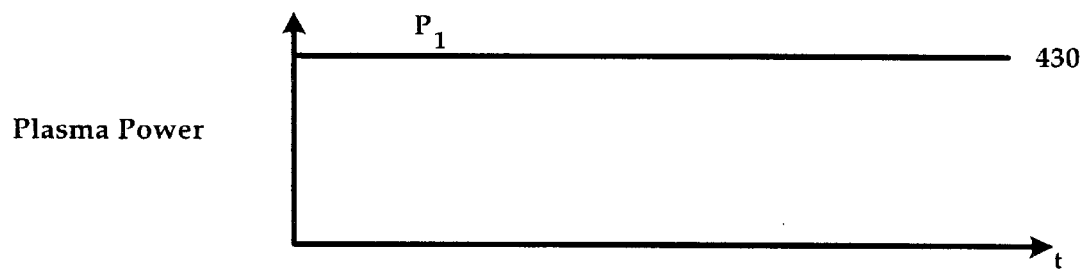
Figure 4D:
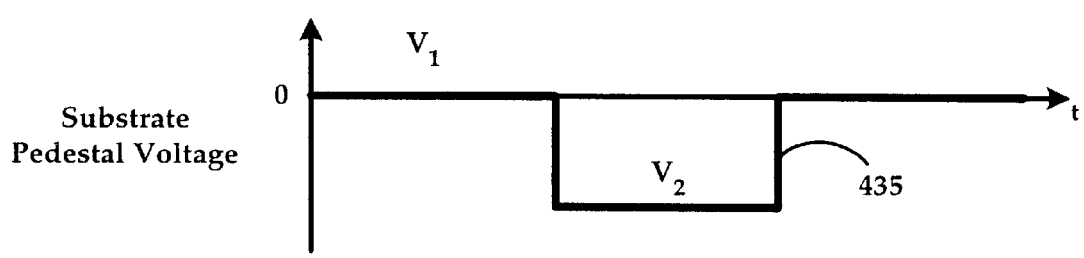

Alternatively, subjecting the substrate 181 to a non-constant wafer voltage bias 185 can vary the incoming ion energy at a fixed plasma power 160 (i.e., ion flux). This preferred embodiment of MII-ALD is illustrated conceptually in FIGS. 3B, and more explicitly in FIGS. 4B and 4D. FIG. 3B shows the MII-ALD method utilizing ion energy modulation 350 to vary the substrate 181 exposure to ions 177 by varying the substrate bias 185. The applied bias 185 can take the form of variations in frequency (periodicity), magnitude, and duty-cycle. A DC as shown in FIG. 4D or RF (e.g., 400 kHz, 2 MHz, 13.56 MHz, etc.) as shown in FIG. 4B power supply can be used. When the wafer potential is "low" (e.g., near or at zero with respect to ground), the incoming ions 177 do not have enough energy to induce surface deposition reactions. When the wafer 181 potential is "high" (e.g., at a significant negative potential relative to ground), the incoming ions 177 will have the necessary energy to induce surface deposition reactions via collision cascades. In such a fashion, the deposition can be turned "on" or "off" by modulating the wafer bias voltage 185, and hence the impinging ion 177 energy. Typical wafer voltages can range from generally −20 V to −1000 V, but preferably in the −25 V to −500 V range, and more preferably in the −50 V to −350 V range during deposition. The bias voltage 185 is coupled to the wafer via the pedestal 182. Preferably, the substrate pedestal 182 is an electrostatic chuck (ESC) to provide efficient coupling of bias voltage to the substrate. The ESC is situated in the main processing chamber 180 and can be cooled via a fluid coolant (preferably a liquid coolant) and/or heated (e.g., resistively) to manipulate the substrate temperature.

Figure 5:
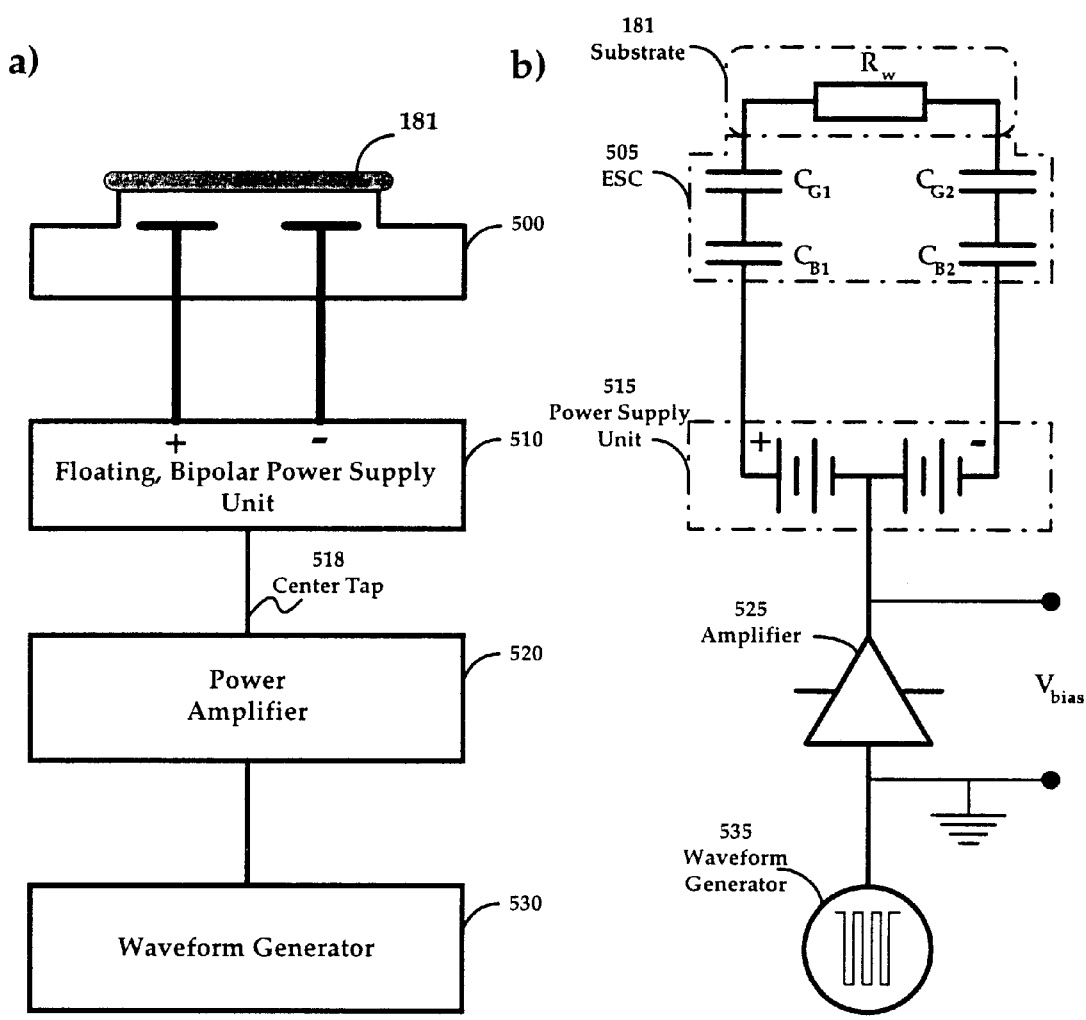
FIGS. 5a and 5b show an electrostatic chuck (ESC) system suitable for modulating the ion energy in the MII-ALD process: a) in topological form; and, b) as an equivalent electrical circuit.

As illustrated in FIGS. 5a and 5i for the case of an applied DC bias, the preferred electrostatic chuck is a "coulombic" ESC 500 (bulk resistivity generally greater than $10^{13}$ ohm-cm) rather than one whose bulk material effects are dominated by the Johnson-Rahbek (JR) effect (bulk resistivity between $10^8$ and $10^{12}$ ohm-cm). Typically, the substrate potential is a complex function of the voltage of the electrostatic "chucking"0 electrodes if these voltages are established relative to a reference potential, but is simplified in the case of "coulombic" (non-JR) ESC. However, if the power supply 510 that powers the ESC 500 is truly floating, i.e., the entire system has a high impedance to the chamber 180 potential (usually ground) including the means of supplying power, then the substrate potential can be arbitrary. In particular, if the ESC power supply 510 is also center-tapped 518, then the wafer potential can be established by connecting the center tap 518 to the output of a power amplifier 520. This power amplifier can be controlled by a computer or a waveform generator 530 to periodically drop the substrate potential to a negative value for a certain period of time. It is desired to have independent control of the magnitude, frequency (periodicity), and duty cycle of this substrate bias pulse train. Such an ESC system is depicted in FIG. 5, which shows an ESC system suitable for modulating the ion energy in the MII-ALD process: a) in topological form; and, b) as an equivalent electrical circuit.

The deposition rate is affected by the choice of the critical bias pulse train variables: the magnitude, frequency (periodicity), and duty cycle. Preferably, when the bias frequency is high (e.g., 100 Hz–10 KHz) with a short duty cycle (e.g., less than 30%), reducing the net, time-averaged current (which can cause substrate potential drift, de-chucking problems, or charge-induced device damage) while providing a charge relaxation period wherein the ion charges accumulated during ion exposure can redistribute and neutralize.

Once the deposition rate is calibrated for a particular recipe (Angstroms/cycle), the ability to accurately determine the film thickness by counting cycles is a further benefit of this modulation scheme. The higher the frequency, the finer the resolution of this critical deposition process performance metric.

Figure 4E:
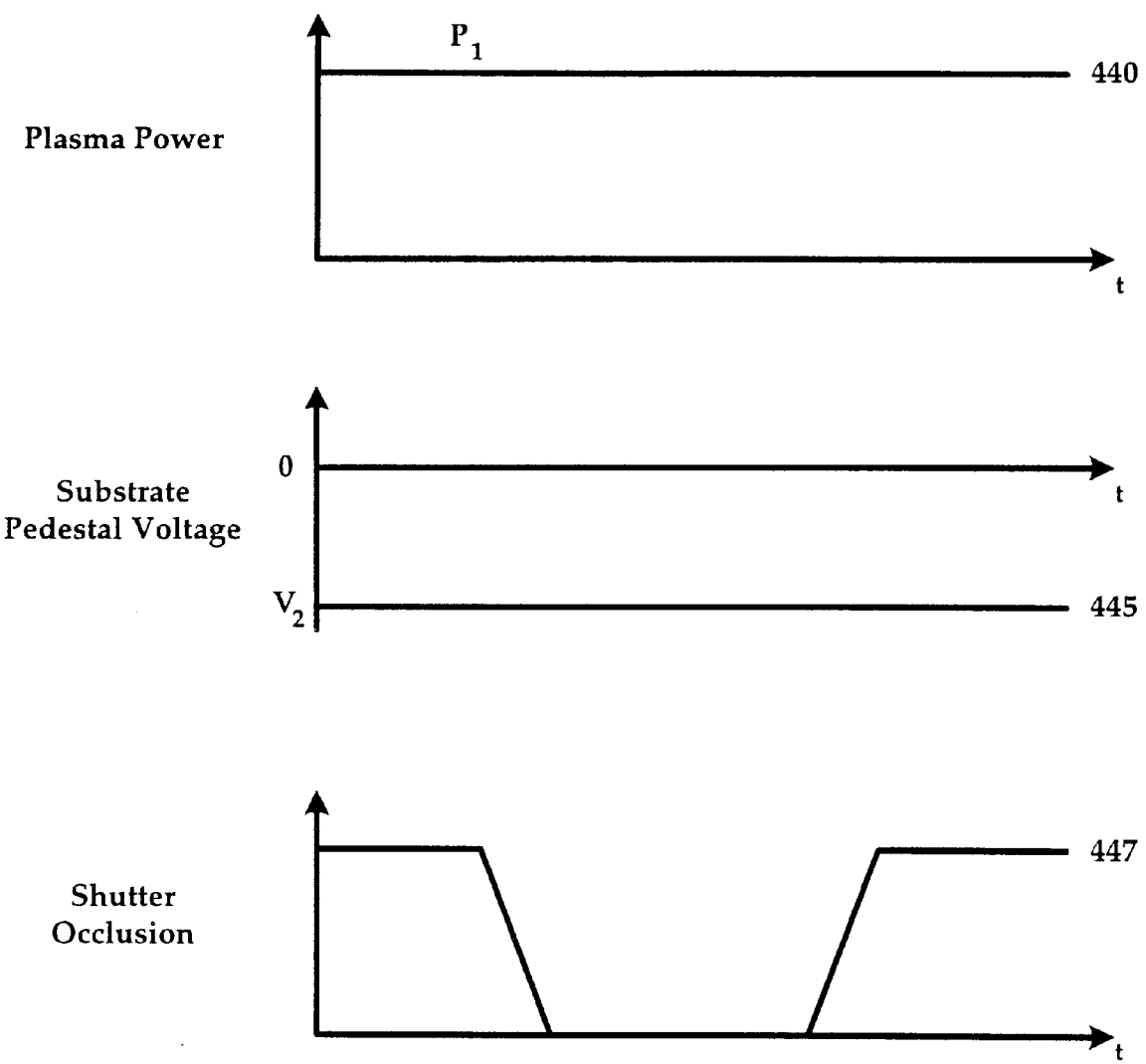
Figure 4F:
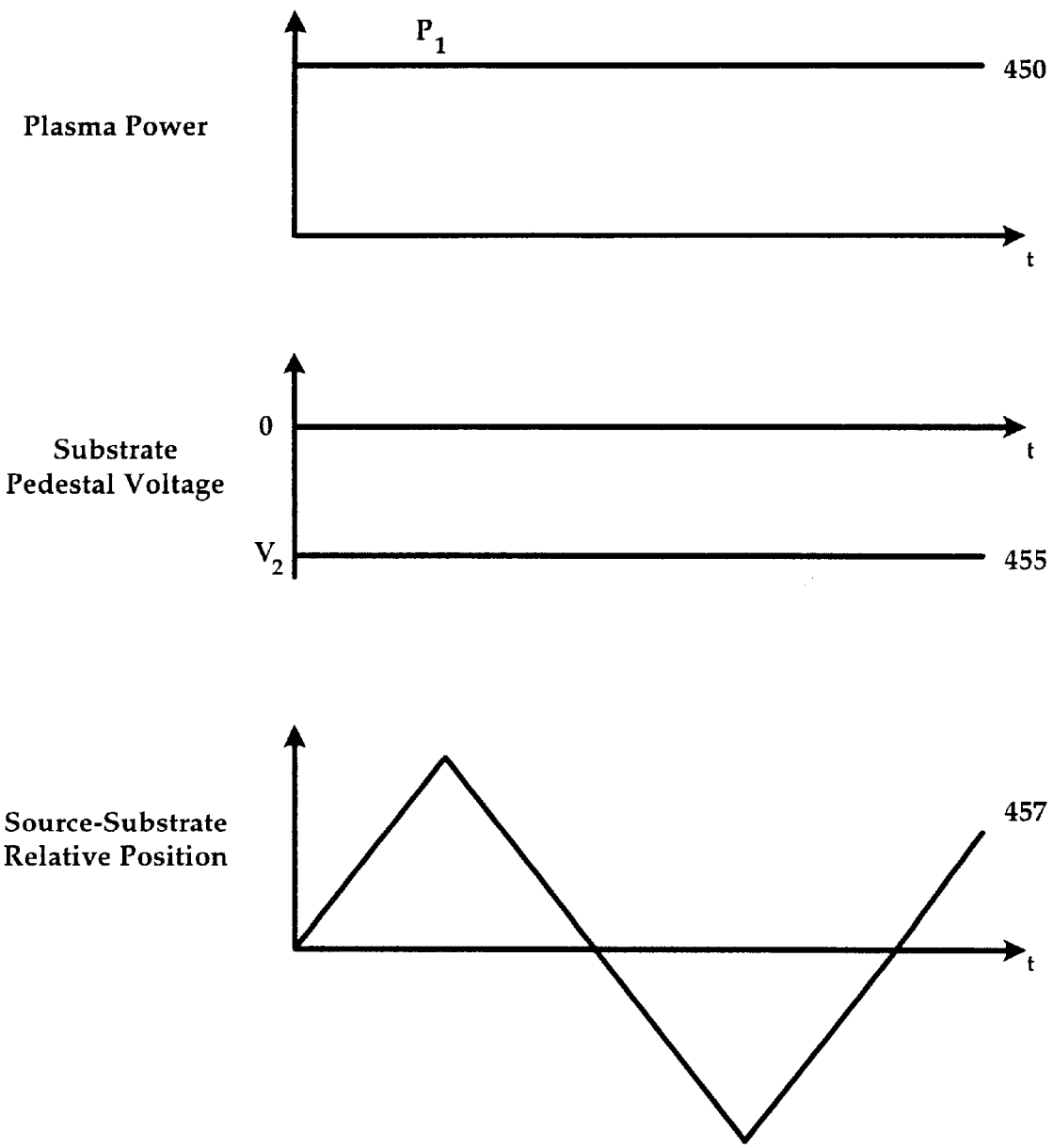

Alternatively, the substrate potential can be modulated by imparting an induced DC bias to the substrate by applying RF power to the pedestal. Preferably, the RF power is coupled into the ESC electrodes. FIGS. 4A–F illustrate the preferred methods of modulating the MII-ALD process. In FIG. 4A, an RF bias power $B_2$ is applied to the substrate pedestal 182 imparting an induced DC bias $V_2$ to the substrate while the plasma (either microwave or RF) power 400 is varied periodically between a high $P_1$ and a low $P_2$ power state. In FIG. 4B, plasma (either microwave or RF) power 410 is constant $P_1$ while an RF bias power, applied to the substrate pedestal 182, is varied between a low $B_1$ and a high $B_2$ bias state ($V_1$ and $V_2$ are the DC offset or bias voltages resulting from the applied RF bias power). In FIG. 4C, a negative DC bias 425 is applied to the substrate pedestal 182 while the plasma (either microwave or RF) power 420 is varied periodically between a high $P_1$ and a low power $P_2$ state. In FIG. 4D, plasma (either microwave or RF) power is constant 430 while a DC bias 435 applied to the substrate pedestal 182 is varied between a zero $V_1$ and a negative voltage state $V_2$. In FIG. 4E, a mechanical shutter periodically occludes the ion source. All the while, the plasma power 440 (either microwave or RF) and substrate voltage 445 are held constant. In FIG. 4F, a source area that is smaller than the substrate 181 is preferably used. In this case, plasma (either microwave or RF) power 450 is constant, a negative DC substrate bias 455 is constant, and the source and substrate 181 are moved relative to each other 457, exposing only a portion of the substrate 181 at a time. The methods proposed in FIG. 4B and FIG. 4D, whereby the substrate bias is modulated at a constant plasma power 410, 430 and hence ion flux, are most preferred.

MII-ALD can be used to deposit dielectric, semiconducting, or metal films, among others, used in the semiconductor, data storage, flat panel display, and allied as well as other industries. In particular, the method and apparatus is suitable for the deposition of barrier layers, adhesion layers, seed layers, low dielectric constant (low-k) films, and high dielectric constant (high-k) films.

This process utilizes independent control over the three constituents of plasma—ions, atoms, and precursors. Decoupling these constituents offer improved control over the deposition process.

An added benefit of using MII-ALD is that with proper choice of the second reactant, selective ion-enhanced etching and removal of unwanted impurities can be performed. As an example, for many chemistries, the preferred second reactant is monatomic hydrogen (H) 176. Simultaneous energetic ion and reactive atomic H bombardment will cause selective removal of unwanted impurities (e.g., containing carbon, oxygen, fluorine, or chlorine) commonly associated with organometallic precursors (e.g., TBTDET, PEMAT, PDEAT, TDMAT, TDEAT), and proceed with removal rates superior to either chemical reaction (e.g., atomic H only) or physical sputtering (e.g., Ar ion only) alone. Impurities lead to high film resistivities, low film density, poor adhesion, and other deleterious film effects. Alternatively, in addition to atomic hydrogen, other reactive groups such as nitrogen atoms (N), oxygen atoms (O), OH molecules, or NH molecules, or a combination thereof may be employed.

From the description of the preferred embodiments of the process and apparatus set forth above, it is apparent to one of ordinary skill in the art that variations and additions to the embodiments can be made without departing from the principles of the present invention. As an example, chlorine, bromine, fluorine, oxygen, nitrogen, hydrogen, other reactants and/or radicals containing the aforementioned elements or a combination thereof, in conjunction with energetic ion bombardment, can be used to effect etching or material removal as opposed to deposition. This is of particular importance in the cleaning of native oxides of copper, aluminum, silicon, and other common conductor and semiconductor materials used in IC manufacturing. Either the deposition or etching can be accomplished globally (as illustrated in the preceding embodiments) or may be chosen to be local to a controlled area (i.e., site-specific using a small, ion beam point or broad-beam source scanned or otherwise stepped across the substrate, exposing only a fraction of the substrate area at any given time).

What is claimed is:

1. A method for depositing a thin film onto a substrate in an evacuated chamber comprising:
    placing said substrate onto a substrate holder in a deposition chamber area; introducing at least one ion generating feed gas into a plasma generation chamber area in communication with said deposition chamber area, but substantially isolated via a distribution showerhead comprised of one or more apertures located between said plasma generation chamber area and said deposition chamber area;

introducing at least one radical generating feed gas into said plasma generation chamber area;

generating a plasma from said ion generating feed gas to form ions; generating a plasma from said radical generating feed gas to form radicals; electrically biasing said substrate to a negative potential;

introducing at least one reactant gas into said deposition chamber area; adsorbing at least one monolayer of said reactant gas on said substrate; exposing said substrate to said ions and said radicals;

modulating said ions; and reacting said adsorbed monolayer of said reactant gas with said ions and said radicals to deposit said thin film.

2. The method of claim 1, wherein at least one aperture of said one or more apertures of said distribution showerhead has dimensions through which said ions and said radicals may pass.

3. The method of claim 2, further comprising a pressure differential created between said plasma generation chamber area and said deposition chamber area via a pressure drop across at least one aperture of said one or more apertures of said distribution showerhead with the pressure in said plasma generation chamber area greater than the pressure in said deposition chamber area.

4. The method of claim 3, wherein said pressure differential causes said ions and said radicals to flow from said plasma generation chamber area to said deposition chamber area via at least one aperture of said one or more apertures of said distribution showerhead.

5. The method of claim 3, wherein the pressure in said plasma generation chamber area is greater than or equal to about 5 times the pressure in said deposition chamber area.

6. The method of claim 5, wherein the pressure in said plasma generation chamber area is greater than or equal to about 10 times the pressure in said deposition chamber area.

7. The method of claim 3, wherein said pressure drop limits said reactant gas in said deposition chamber area from intermixing with said plasma generated in said plasma generation chamber area.

8. The method of claim 1, wherein said distribution showerhead prevents said reactant gas in said deposition chamber area from intermixing with said plasma generated in said plasma generation chamber area.

9. The method of claim 1, wherein said substrate is simultaneously exposed to said ions and said radicals.

10. The method of claim 1, wherein said substrate is exposed to said ions after exposure to said radicals.

11. The method of claim 1, wherein a pressure of said deposition chamber area is maintained in a range of approximately $10^2$ to $10^{-7}$ torr during processing.

12. The method of claim 1, wherein said pressure of said deposition chamber area is maintained in a range of approximately 1 to $10^{-4}$ torr during processing.

13. The method of claim 1, wherein application of said bias occurs during ion exposure.

14. The method of claim 1, wherein application of said bias occurs during radical exposure.

15. The method of claim 1, wherein application of said bias occurs during simultaneous ion and radical exposure.

16. The method of claim 1, wherein said bias is coupled to said substrate via said substrate pedestal on which said substrate rests.

17. The method of claim 16, wherein said substrate pedestal is an electrostatic chuck (ESC) to provide coupling of said bias voltage to said substrate.

18. The method of claim 1, wherein said electrical bias is produced by a direct current power supply.

19. The method of claim 1, wherein said electrical bias is induced by a radio frequency power supply.

20. The method of claim 19, wherein said radio frequency is selected from the group consisting of 400 kHz, 2 MHz, and 13.56 MHz.

21. The method of claim 1, wherein said negative potential is between about $-20$ V to $-1000$ V relative to ground.

22. The method of claim 21, wherein said negative potential is between about $-25$ V to $-500$ V relative to ground.

23. The method of claim 22, wherein said negative potential is between about $-50$ V to $-350$ V relative to ground.

24. The method of claim 1, wherein said reactant gas is selected from the group consisting of Ta containing precursors, W containing precursors, Ti containing precursors, Mo containing precursors, Hf containing precursors, and Cu containing precursors.

25. The method of claim 1, wherein said reactant gas is a metal halide.

26. The method of claim 25, wherein said metal halide is selected from the group consisting of $TaCl_5$, $TaBr_5$, $WF_6$, $TiCl_4$, and CuCl.

27. The method of claim 1, wherein said reactant gas is an organometallic.

28. The method of claim 27, wherein said organometallic is selected from the group consisting of pentakis (diethylamido)tantalum (PDEAT), pentakis (ethylmethylamido)tantalum (PEMAT), t-butylimino tris (diethylamino) tantalum (TBTDET), $W(CO)_6$, tetrakis (dimethylamido)titanium (TDMAT), tetrakis(diethylamido) titanium (TDEAT), and (Trimethylvinylsilyl) hexafluoroacetylacetonato Copper I (Cu(TMVS)(hfac)).

29. The method of claim 1, wherein said radical generating feed gas is selected from the group consisting of $H_2$, $O_2$, $N_2$, $NH_3$, and $H_2O$ vapor.

30. The method of claim 1, wherein said generated radicals are selected from a group consisting of hydrogen atoms, nitrogen atoms, oxygen atoms, OH molecules, and NH molecules.

31. The method of claim 1, wherein said ion generating feed gas is selected from a group consisting of Argon, Krypton, Neon, and Xenon.

32. The method of claim 1, wherein said generated ions are selected from a group consisting of $Ar^+$, $Kr^+$, $Ne^+$, and $Xe^+$.

33. The method of claim 1, further comprising exposing said substrate to at least one additional reactant gas.

34. The method of claim 1, further comprising exposing said substrate to said reactant gas while varying exposure of said substrate to said ions via said ion modulation.

35. The method of claim 34, wherein said ion modulation is effected in a way selected from the group consisting of modulating an ion flux and modulating an ion energy.

36. The method of claim 35, wherein modulation in said ion flux is modulated in a way selected from the group consisting of modulating a flow of said ion generating feed gas, modulating a power of said plasma, mechanically occluding said ions, and modulating the relative movement between said plasma and said substrate.

37. The method of claim 36, wherein said plasma power is periodically modulated in a way selected from the group consisting of periodicity and magnitude.

38. The method of claim 36, wherein a frequency of said plasma power is selected from the group consisting of 400 kHz, 2 MHz, 13.56 MHz, and 2.45 GHz.

39. The method of claim 37, wherein said ion flux is modulated within a periodicity range of 0.1 Hz to 20 MHz.

40. The method of claim 39, wherein said ion flux is modulated within a periodicity range of 10 Hz to 10 kHz.

41. The method of claim 1, wherein said ion modulation occurs by modulating a magnitude of said negative potential bias on said substrate.

42. The method of claim 41, wherein said modulation of said negative potential magnitude is effected in a way selected from the group consisting of changing a magnitude of a direct current bias potential on said substrate and changing a magnitude of a radio frequency power applied to said substrate thereby inducing a change in said magnitude of said substrate bias potential.

43. The method of claim 41, wherein said negative potential magnitude is modulated within a periodicity range of 0.1 Hz to 20 MHz.

44. The method of claim 43, wherein said negative potential magnitude is modulated within a periodicity range of 10 Hz to 10 kHz.

45. The method of claim 1, wherein said electrical bias is modulated in a way selected from the group consisting of periodicity, magnitude, and duty-cycle.

46. The method of claim 1, further comprising varying said electrical bias applied to said substrate while a power of said plasma is maintained.

47. The method of claim 1, further comprising varying a power of said plasma while said electrical bias applied to said substrate is maintained.

48. The method of claim 1, further comprising occasionally occluding said ions while a power of said plasma and said electrical bias applied to said substrate are maintained.

49. The method of claim 1, further comprising maintaining said substrate at a temperature of between about 25° C. to 350° C.

50. The method of claim 49, wherein said temperature is maintained between about 20° C. to 250° C.

51. The method of claim 50, wherein said temperature is maintained between about 100° C. to 200° C.

52. The method of claim 1, further comprising said ions and said radicals removing unwanted impurities from said substrate prior to said adsorption of said monolayer of said reactant gas.

53. The method of claim 52, wherein said ions are selected from a group consisting of $Ar^+$, $Kr^+$, $Ne^+$, and $Xe^+$.

54. The method of claim 52, wherein said unwanted impurities are selected from the group consisting of carbon-, oxygen-, fluorine-, and chlorine-containing impurities.

55. The method of claim 52, wherein said radicals are selected from the group consisting of hydrogen atoms, nitrogen atoms, OH molecules, and NH molecules.

56. The method of claim 52, wherein said monolayer is an organometallic.

57. The method of claim 52, wherein said monolayer is a metal halide.

58. The method of claim 1, further comprising said ions and said radicals removing unwanted impurities from said monolayer during said film deposition reaction.

59. The method of claim 58, wherein said monolayer is a metal halide.

60. The method of claim 58, wherein said unwanted impurities are selected from the group consisting of carbon-, oxygen-, fluorine-, and chlorine-containing impurities.

61. The method of claim 58, wherein said radicals are selected from the group consisting of hydrogen atoms, nitrogen atoms, OH molecules, and NH molecules.

62. The method of claim 58, wherein said monolayer is an organometallic.

63. The method of claim 58, wherein said ions are selected from a group consisting of $Ar^+$, $Kr^+$, $Ne^+$, and $Xe^+$.

64. The method of claim 1, wherein said adsorption of said monolayer of said reactant gas on said substrate occurs via chemisorption.

* * * * *

UNITED STATES PATENT AND TRADEMARK OFFICE
CERTIFICATE OF CORRECTION

PATENT NO. : 6,416,822 B1
DATED : July 9, 2002
INVENTOR(S) : Tony P. Chiang et al.

It is certified that error appears in the above-identified patent and that said Letters Patent is hereby corrected as shown below:

<u>Title page,</u>
The name of the Assignee is -- Angstron Systems, Inc. --

Signed and Sealed this

Nineteenth Day of November, 2002

*Attest:*

*Attesting Officer*

JAMES E. ROGAN
*Director of the United States Patent and Trademark Office*